(12) United States Patent
Lee

(10) Patent No.: US 6,288,335 B1
(45) Date of Patent: Sep. 11, 2001

(54) PACKAGE FOR AT LEAST ONE SEMICONDUCTOR BODY

(75) Inventor: Charles-Wee-Ming Lee, Singapore (SG)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/479,023

(22) Filed: Jan. 7, 2000

Related U.S. Application Data

(63) Continuation of application No. PCT/DE98/01851, filed on Jul. 3, 1998.

(30) Foreign Application Priority Data

Jul. 7, 1997 (DE) .............................................. 197 28 992

(51) Int. Cl.$^7$ .............................. H01L 23/28; H05K 5/06
(52) U.S. Cl. ..................... 174/52.2; 174/52.4; 257/788; 257/793
(58) Field of Search ................... 174/52.2, 52.4; 257/787, 788, 789, 791, 792, 793, 794, 795, 796

(56) References Cited

U.S. PATENT DOCUMENTS

| 5,289,346 | 2/1994 | Carey et al. | 361/777 |
| 5,336,931 | * 8/1994 | Juskey et al. | 257/787 |
| 5,496,775 | 3/1996 | Brooks | 438/127 |
| 5,627,405 | 5/1997 | Chillara | 257/668 |
| 5,981,314 | * 11/1999 | Glenn et al. | 438/127 |
| 6,034,333 | * 3/2000 | Skipor et al. | 174/260 |

FOREIGN PATENT DOCUMENTS

| 19500655A1 | 7/1996 | (DE) . |
| 0 876 030 A2 | 11/1998 | (EP) . |
| 08017864 | 1/1996 | (JP) . |
| 08236586 A | 9/1996 | (JP) . |
| 09107052A | 4/1997 | (JP) . |

OTHER PUBLICATIONS

Japanese Patent Abstract No. 02125633 (Kenji), dated May 14, 1990.
Japanese Patent Abstract No. 08335653 (Tadao), dated Dec. 17, 1996.
Japanese Patent Abstract No. 56043748 (Susumu), dated Apr. 22, 1981.
Shinji Baba et al.: "Molded Chip Scale Package for high Pin Count", 1996 Electronic Components and Technology Conference, pp. 1251–1257.

* cited by examiner

*Primary Examiner*—Dean A. Reichard
*Assistant Examiner*—Hung V Ngo
(74) *Attorney, Agent, or Firm*—Herbert L. Lerner; Laurence A. Greenberg; Werner H. Stemer

(57) ABSTRACT

A package for at least one semiconductor body. The package is characterized by being configured in two parts. A first part of the package contains a thin supporting frame which has a thickness of a few micrometers which completely surrounds the surface of the semiconductor body and is raised above a top surface of the semiconductor body at the edge of the semiconductor body. The second part of the package has a cover which is as flat as possible which covers the entire second surface and at least partially covers an upper rim of the supporting frame. A compound forming the supporting frame has a considerably greater viscosity than a compound forming the cover. The supporting frame is used as a flow stop for the covering compound during production of the package. Such so-called PBCSP packages allow packaged components to be produced which have an optimum chip/package ratio. Furthermore, such packaged components have the advantage that they are protected against external influences such as temperature, moisture, humidity and mechanical stress. In comparison with so-called flip chips or bar dies, PBCSP packages according to the invention have the advantage that they are easy to transport and to handle.

5 Claims, 3 Drawing Sheets

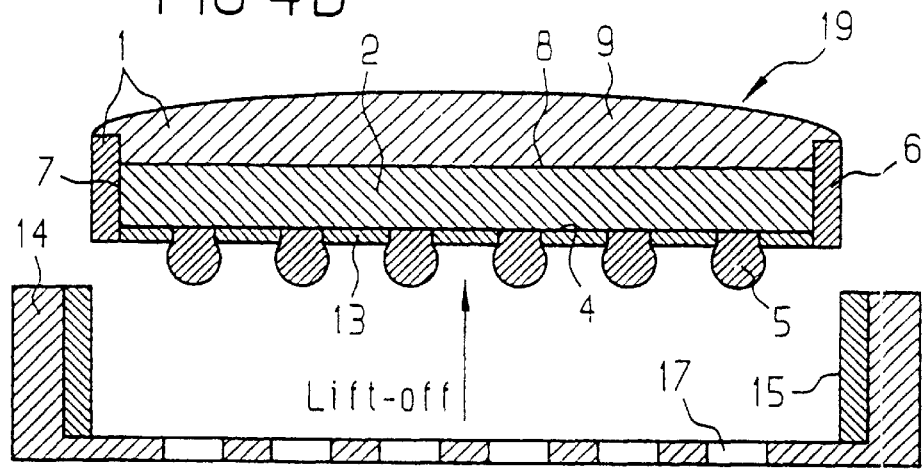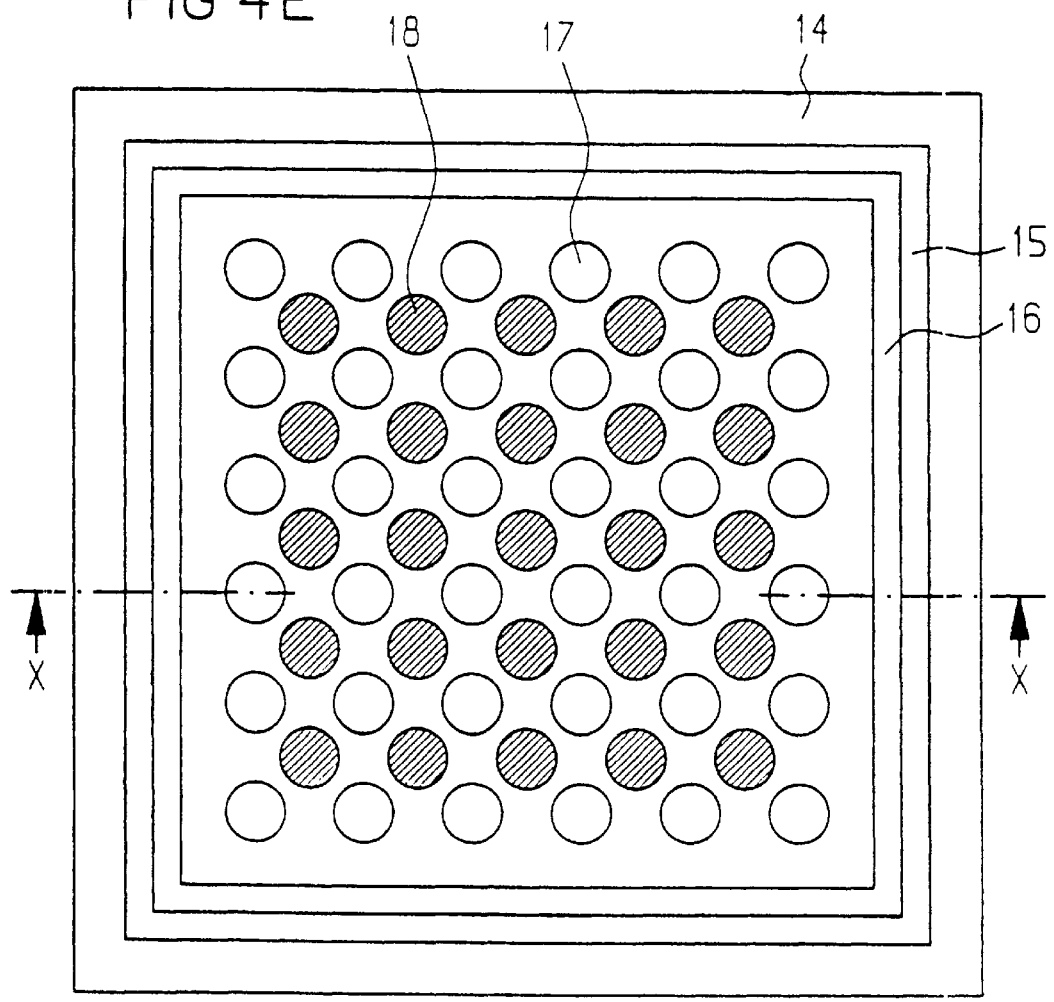

PACKAGE FOR AT LEAST ONE SEMICONDUCTOR BODY

CROSS-REFERENCE TO RELATED APPLICATION

This is a continuation of copending International Application PCT/DE98/01851, filed Jul. 3, 1998, which designated the United States.

BACKGROUND OF THE INVENTION

Field of the Invention

The present invention relates to a package for at least one semiconductor body.

A unit of this generic type, which is referred to for short in the following text as a "package component", may, for example, be a memory module which is intended, for example, for mounting on a printed circuit board configuration.

In the case of complex semiconductor bodies, in particular for memory modules, the number of external contacts, the so-called I/O ports, is increasing. Nowadays, chips with more than a thousand I/O ports exist, and several thousand I/O ports are believed to be possible. In order to match this requirement, the I/O ports in such package components are generally no longer routed out at the chip edge, for space reasons, but the contacts are routed out from one surface of the semiconductor body. Since the connecting pads need not be positioned at the chip edge, the signal can advantageously be routed directly out of the chip at the point where it is produced. These extremely short paths have been found to make such components advantageous—in particular for radio-frequency applications. Furthermore, such a component offers a very small installation area, owing to the relatively small connecting pads.

Such a module may be, for example, a so-called flip chip module. The flip chip module has no package and is in the category of bar dies. The connection technology used here is called C4 and is short for control collapse chip connection. C4 technology has been used for more than 20 years in a large number of products.

SUMMARY OF THE INVENTION

It is accordingly an object of the invention to provide a package for at least one semiconductor body which overcome the above-mentioned disadvantages of the prior art devices and methods of this general type, which has a considerably higher chip/package ratio than CSP technology and which can be produced simply and cost-effectively.

With the foregoing and other objects in view there is provided, in accordance with the invention, a package for a semiconductor body, the semiconductor body having a first and a second surface, an edge surface surrounding the semiconductor body, and a plurality of contact points on the first surface, the semiconductor body further having a plurality of connecting elements, at least some of the connecting elements making contact with the contact points and via which the semiconductor body can make electrical contact with a printed circuit board, the package including:

a first part formed of a thin supporting frame for completely surrounding the edge surface of the semiconductor body, the thin supporting frame having an upper rim rising above the second surface of the semiconductor body at the edge surface and the thin supporting frame is formed of a first compound; and a second part formed of a substantially flat cover for entirely covering the second surface of the semiconductor body and at least partially covering the upper rim of the thin supporting frame, the flat cover is formed of a second compound and the first compound forming the supporting frame has a substantially greater viscosity than the second compound.

Such package components according to the invention are referred to as polymer bumper chip scale packages (PBCSP) in the following text.

The present invention allows all the advantages of flip chip technology and CSP technology to be combined in a simple manner, without having to accept the disadvantages resulting from them.

The major advantage of the present invention is that the PBSCP component according to the invention, which is formed in two parts, has an optimized chip/package ratio owing to the very thin supporting frame. In consequence, the package can be produced simply and very cost-effectively.

Furthermore, the completed package component is protected against external influences and against damage during transport and production. The complete package component can advantageously be laser-marked.

The material for the supporting frame normally has a very high viscosity. Typically, the supporting compound is extremely consistent at room temperature. In contrast, the compound for the cover has a much lower viscosity than the supporting compound. Normally, the supporting compound is applied first and is used, during the next process step, as a flow stop for the cover compound. This prevents the cover compound, which is applied during production and is still liquid, from flowing over the rim of the semiconductor bodies.

A polymer is normally used as the supporting compound. The polymer has a high viscosity at room temperature, and is thus extremely consistent in normal conditions. This is particularly advantageous if the package is transported or handled by machines between the process steps. Other commercially available plastics or similar materials that have a high viscosity at room temperature may also be used as the supporting compound.

A so-called glob top is typically used as the cover compound. The glob top may be, for example, an epoxy resin or some other commercially available resin. It is also feasible for a gel-like substance or something similar to be used as the glob top.

Typically, those regions on the front face of the chip that are not provided with contact points are protected by a passivation layer. In this way, the front face of the chip is protected against environmental influences, such as moisture, humidity, mechanical stress, corrosion etc.

It is particularly advantageous if the regions between the connecting elements and the printed circuit board are filled by a filler. In particular, this protects the contact connections. Connecting element fractures, which lead to a malfunction of the semiconductor component, can be avoided by this measure.

During the production of the package components, it is absolutely essential for those surfaces of the holder which come into contact with the package component to be composed of a non-adhering material. Otherwise, the package components that have just been completed could possibly become damaged when released from the holder.

The non-adhering material should be a material which does not react with the material of the package component at high temperatures. Typically, TEFLON is used as the non-adhering material. However, it is also feasible to use any other material with similar material characteristics.

It is particularly advantageous for the holder for the package components to contain an m×n matrix. This allows a plurality of package components to be processed at the same time, as a result of which the production costs for the package components can be drastically reduced.

Other features which are considered as characteristic for the invention are set forth in the appended claims.

Although the invention is illustrated and described herein as embodied in a package for at least one semiconductor body, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 4A–4D are sectional views of a preferred production method for the PBCSP formed of four process steps; and FIG. 4E is a plan view of the PBCSP.

DESCRIPTION OF THE PREFERRED EMBODIMENTS

Figure 1:
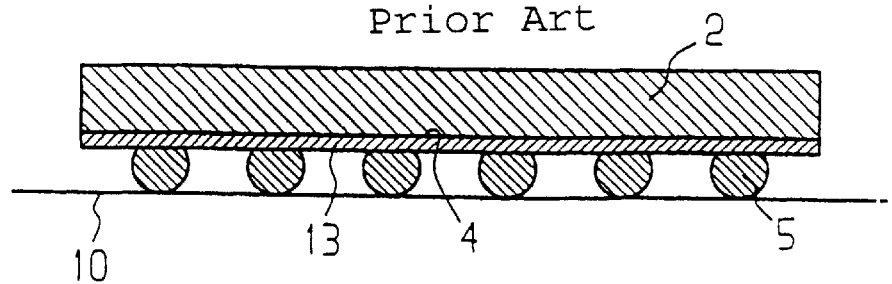
FIG. 1 is a diagrammatic, sectional view of a semiconductor body using flip chip technology according to the prior art.

In all the figures of the drawing, sub-features and integral parts that correspond to one another bear the same reference symbol in each case. Referring now to the figures of the drawing in detail and first, particularly, to FIG. 1 thereof, there is shown a known bonded flip chip module. Bonded connecting elements 5 are located on a front face 4 of a semiconductor body 2. The semiconductor body 2 can be connected to a printed circuit board 10 via these connecting elements 5. In the above example, the connecting elements 5 are configured with a spherical shape. The spherical connecting elements 5 may, for example, be bonded to the silicon chip using ball grid array (BGA) technology. A passivation layer 13 is applied to those regions of the front face 4 of the chip with which contact is not made. Since semiconductor bodies produced using flip chip technology have no package, the chip/package ratio is optimum in this case. However, such components are extremely difficult to handle by virtue of the process, particularly for transportation. This necessarily results in an increased scrap rate. Furthermore, such components are subject to external influences, such as mechanical stress, moisture, humidity and temperature influences, without any protection. Furthermore, it is impossible to laser-mark an unencapsulated module after production.

Figure 2:
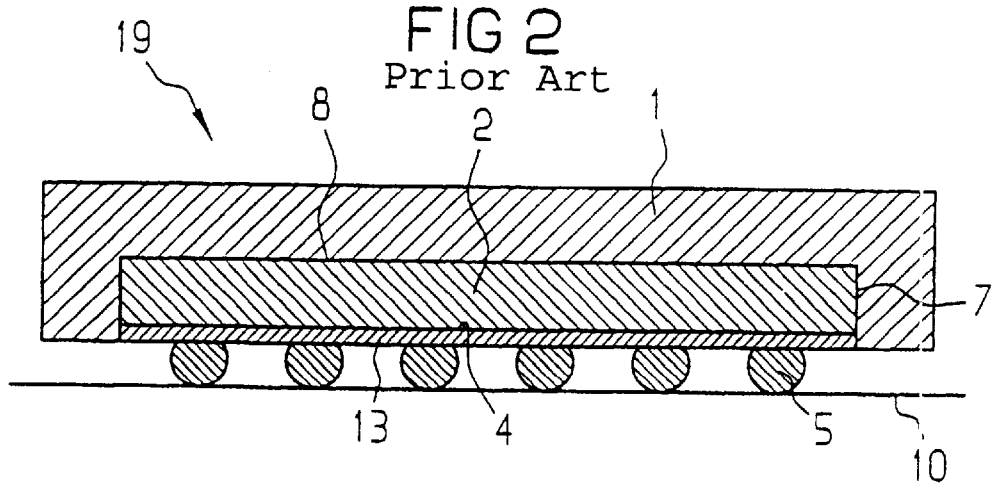
FIG. 2 is a sectional view of a chip scale package according to the prior art.

A further package for a semiconductor module is shown in FIG. 2. FIG. 2 shows the semiconductor body 2 to whose front face 4 the connecting elements 5 are bonded. An edge surface 7 and a rear face 8 of the chip are each encased by a package 1. As shown in the present example, those regions of the front face 4 of the chip with which contact is not made may be covered by the passivation layer 13. The semiconductor body 2 can be connected to the printed circuit board 10 via the connecting elements 5 which, in the present example, are configured with a spherical shape. The package 1 is normally produced by pressing a plastics compound onto the semiconductor chip.

Such a package component 19 is known as a chip scale package (CSP). This technology appears to be suitable for bridging the technology advance for flip chip mounting, since this avoids a number of the disadvantages of flip chip technology. As the name itself indicates, the package is larger than the chip by a specific factor. According to the standardization proposal, the package may be called a chip scale package only if it is not more than 0.2 times larger than the chip itself.

This value reflects the ratio of the package area to the chip area.

Chip scale packages have the advantages over flip chip modules that they are protected against damage during transport and production, and against other external influences. Furthermore, chip scale packages can be laser-marked. However, chip scale package components have the disadvantage, in comparison to flip chip components, of a chip/package ratio of <1. Furthermore, the encapsulation of the plastic package is often highly complex and very expensive. Such components also have an increased scrap rate since, for example, asymmetric flow of the plastic compound during production of the package can lead to defects such as cavities or very fine holes in the plastic.

Figure 3:
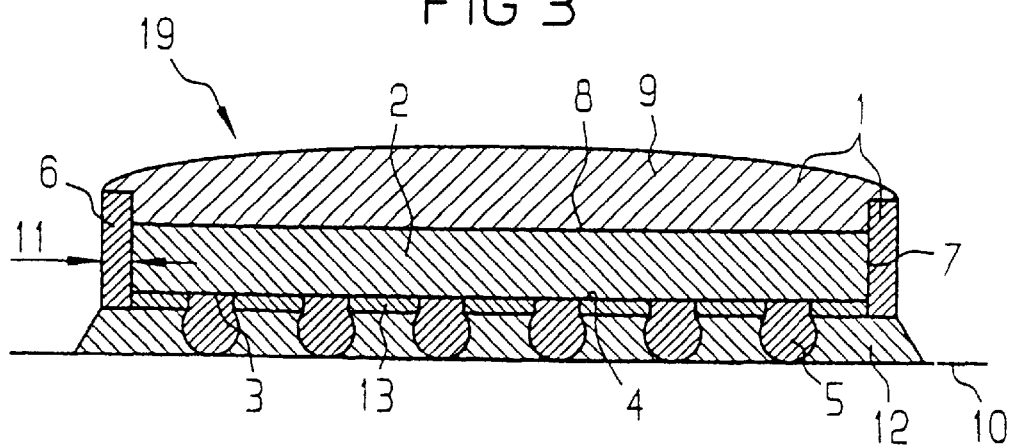
FIG. 3 is a sectional view of a so-called PBCSP according to the invention.

FIG. 3 shows a polymer bumper chip scale packages (PBCSP) according to the invention. FIG. 3 has the package component 19 with the package 1 that surrounds the semiconductor body 2. The semiconductor body 2 may be, for example, a silicon chip. Contact points 3 are located on the first surface 4 of the semiconductor body 2. Electrical contact can be made with the semiconductor body 2 via the contact points 3. In the present example, contact is made with the contact points 3 of the semiconductor body 2 by use of the connecting elements 5, some of which are spherical. Those regions of the first surface 4 with which contact is not made are, in the present example, covered by the passivation layer 13 in order to protect the surface. The semiconductor body 2 can be electrically connected via the connecting elements 5 to corresponding contacts on the printed circuit board 10. In the present example, the regions between the package component 19 and the printed circuit board with which contact is made are filled by a filler 12.

The package 1 surrounds the semiconductor body 2 in such a manner that the edge surface 7 of the semiconductor body 2 as well as the second surface 8 of the package 1 are covered. According to the invention, the package 1 contains a supporting frame 6 and a cover 9.

In this case, the supporting frame 6 encloses the entire edge surface 7 of the silicon chip 2. The supporting frame 6 has a given width 11. However, it is essential to the invention that the supporting frame 6 is raised above the second surface 8 at the edge of the silicon chip 2. At the side of the first surface 4, the supporting frame 6 typically, but not necessarily, ends with the first surface 4.

On the second surface 8 of the silicon chip 2, the cover 9 covers the entire surface of the silicon chip 2. In this case, the cover 9 may also partially cover the supporting frame 6.

The cross section of the supporting frame 6 is ideally in the form of a rectangle having the given width 11. However, this is not absolutely essential. In fact, the shape of the cross section of the supporting frame 6 depends on the material characteristics and on the technology used.

It is essential to the invention that the supporting frame 6 is very thin, in order in this way to ensure a chip/package ratio that is as optimum as possible. Depending on the technology and material used for the supporting frame 6, it is thus possible for the supporting frame 6 to have the given width 11 be a few μm. This allows the package component 19 to be produced with a chip/package ratio of roughly unity.

Furthermore, it is very important for the cover 9 to be configured to be as flat as possible, in order to satisfy the requirements for a flat row of packages.

According to the invention, these requirements can be satisfied by the compound of the supporting frame 6 having a very high viscosity, while the compound of the cover has a much lower viscosity. The supporting frame 6 is produced first during production. The cover 9 is then applied to the rear face 8 of the chip. In this case, the supporting frame 6 forms a flow stop for the low-viscosity compound of the cover 9.

A polymer or a commercially available plastic material is typically used as the material for the supporting frame 6. The compound for the supporting frame 6 is applied at a high temperature. The compound 1 for the supporting frame 6 advantageously has its greatest viscosity, and is extremely consistent for molding, at room temperature.

The material for the cover 9 is typically a commercially available so-called glob top material or a gel-like material having similar material characteristics. The cover compound is likewise applied at high temperature, typically by pouring, spraying, dripping or the like. This ensures that the cover compound is distributed uniformly and covering the entire surface of the silicon chip. For uniform distribution, the silicon chip 2 may also be rotated at high speed on a rotation chuck. After cooling, the viscosity is increased, as a result of which the cover becomes more consistent for deformation. However, the cover 9 does not reach the same hardness as the supporting frame 6.

In order that the supporting frame 6 and the cover 9 retain their shape when temperature fluctuations occur, a curing step is then carried out. In the process, the supporting frame 6 and the cover 9 are cured by a temperature step. During curing, the viscosity of the still viscous covering compound and of the supporting compound is greatly increased. This temperature step is typically carried out at a furnace temperature of 100° C. for one hour. However, it is also feasible for curing to be carried out using UV light.

The use of the filler 12 between the package compound 19 and the printed circuit board 10 is not absolutely essential. For mechanical and electrical reasons, the use of the filler 12 is, however, preferable since this avoids, for example, contact fractures caused by mechanical stress. Furthermore, the connecting elements 5 and connecting pads are protected against corrosion from moisture or humidity.

Typically, the connecting elements 5 of the package 1 are disposed in such a manner that they can make contact with corresponding connecting elements on the printed circuit board 10. It is particularly advantageous to use a BGA package in which the connecting elements 5 have spherical regions. The spherical connecting elements 15 allow solder joints to be produced between the semiconductor body 2 and the printed circuit board 10 in a simple manner.

The cover 9 is primarily used for mechanical protection of the surface and for protection against moisture and humidity as well as against external influences. However, the cover 9 is not suitable for the package component 19 to be handled on the surface of the cover 9, for example for mechanical transport. The supporting frame 6 is provided for this purpose, whose consistency is very much harder than that of the cover 9. The supporting frame 6 is suitable for transporting the package component 19 by machine for example, without the package component 19 being damaged by transportation or by other handling.

An advantageous production method for the PBCSP components according to the invention will be explained in detail in the following text with reference to FIGS. 4A–4E of the drawing.

Figure 4A:
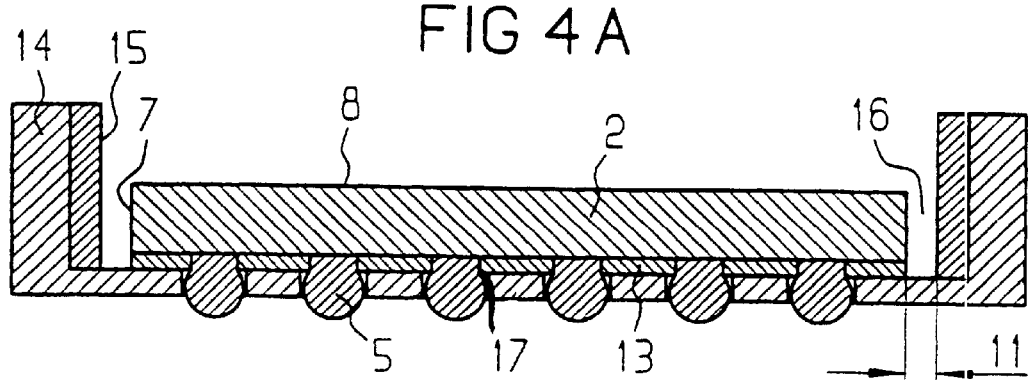

FIG. 4A shows a cross section of a holder 14 for the silicon chip 2 that is provided with the connecting elements 5. Contact element holes 17 are provided on a bottom of the holder 14 in order to hold the connecting elements 5 of the silicon chip 2. A diameter of the holes 17 for the connecting elements 5 is in this case typically marginally larger than a diameter of the connecting elements 5.

Inner walls of the holder 14 are covered over their entire surface by a non-adhering material 15. TEFLON is typically used as the non-adhering material 15. The silicon chip 2 is disposed in the holder 14 in such a way that the edge surface 7 of the silicon chip 2 is at a distance from the side inner wall 15 of the holder 14. The distance between the edge 7 of the silicon chip 2 and the inner wall of the holder 14 defines a gap 16 having the given width 11. The gap 16 typically but not necessarily has a constant width.

Figure 4B:
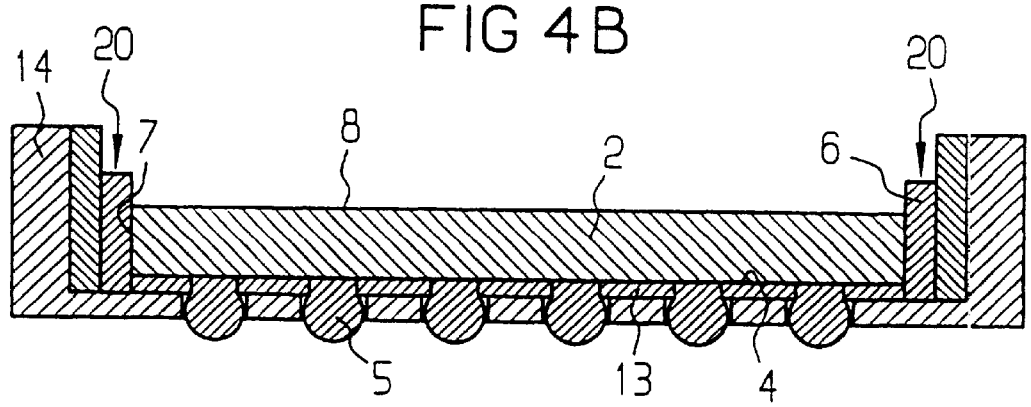

According to FIG. 4B, once the silicon chip 2 has been positioned on the holder 14, a supporting compound 20 is introduced by machine into the gap 16. This may be done by spraying or pouring at a suitable temperature. Since the supporting compound 20 typically has a very high viscosity at room temperature, a very high temperature, normally of several 100° C., is required for application of the supporting compound 20. The gap 16 is in this case filled to above the surface 8 of the silicon chip 2.

Once the gap 16 has been filled with the supporting compound 20, a temperature step is normally carried out, for curing. The curing step is required to give the supporting frame 6 made from the supporting compound 20 a consistent shape. The curing of the supporting frame 6 is typically carried out at high temperature. However, care must be taken to ensure that the curing temperature is below the melting temperature of the connecting elements 5 and of the contact points 3 and metallization.

The curing of the supporting compound 20 may, however, also be carried out by so-called rapid curing in air at room temperature or at a slightly raised temperature. Curing by UV light is also feasible, depending on the material of the supporting frame.

In any case, it is advantageous for the curing to be carried out in a vacuum, in order to allow any enclosed air bubbles to be removed in this way.

Figure 4C:
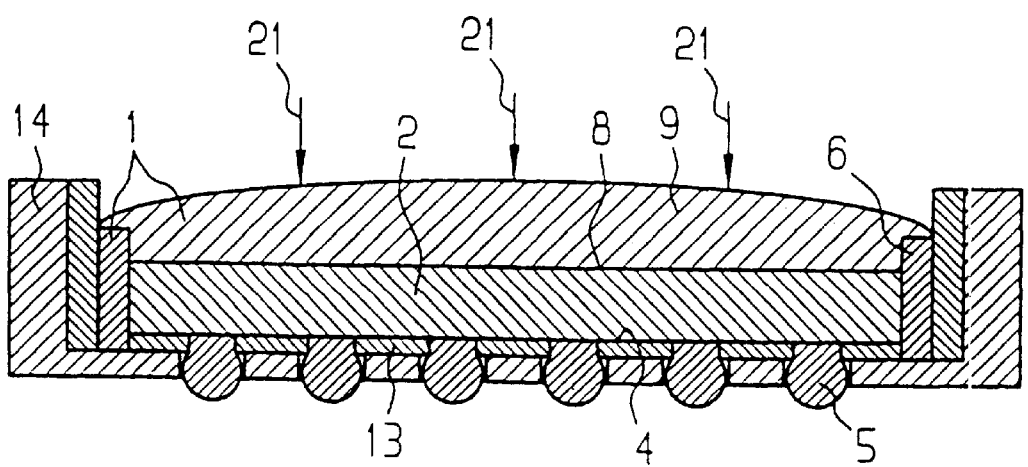

Corresponding to FIG. 4C, a covering compound 21 for forming the cover 9 is then applied uniformly onto the surface 8 of the silicon chip 2.

The covering compound 21 in this case has a much lower viscosity than the compound 20 for the supporting frame 6. For this reason, the covering compound 21 can advantageously be applied at a much lower temperature than the compound 20 for the supporting frame 6. The covering compound 21 may in this case either be centrifuged, sprayed, poured etc., depending on the process machine. The curing of the cover 9 is typically carried out in a similar way to the curing of the supporting compound 20.

Once the package component 19 has been cured sufficiently, it may be knocked out of the holder 14 (see FIG. 4D). Ejection holes 18 are provided in the bottom of the holder 14, in order to knock the package component 19 out of the holder 14. FIG. 4E shows a plan view of the holder 14. The package component 19 can be knocked off the holder 19 by pushing pins up through the ejection holes 18.

For this purpose, it is absolutely essential for all those surfaces of the holder 14 that may come into contact with the package component 19, in particular the inner walls 15 of the holder 14, to be composed of a non-adhering material. Otherwise, the package parts 19 that have just been applied could possibly become detached again by being knocked out of the holder 14.

The non-adhering material 15 should be a material which does not react physically or chemically with the material of the package component 19, in particular at high temperatures. Furthermore, the non-adhering material 15 should remain consistent at the high process temperatures that are used. TEFLON is typically used as the non-adhering material. However, it is also feasible to use any other material that satisfies the above requirements.

The package component 19 can then be tested electrically and functionally. The tested package component 19 is then typically marked by a laser-marking appliance.

Depending on the requirements, contact is then made between the package component 19 and a printed circuit board 10 or a board. In this case, it has been found to be advantageous for the regions between the package component 19 and the board or printed circuit board 10 to be filled by a commercially available filler 12. This measure ensures that the electrical contacts and the connecting elements 5 are protected against mechanical stress. Conductor fractures may thus be avoided. Furthermore, this measure ensures that the connecting elements 5 and the metallization on the printed circuit board 10 and the silicon chip 2 are protected against moisture and humidity, and thus against corrosion. This increases the reliability and yield of the package component 19.

It is advantageous if a plurality of the package components 19 can be processed at the same time. For this reason, it is advantageous for the holder 14 for the package component 19 to contains an m×n matrix, where m is the number of columns and n is the number of rows in the holder 14. M×n package components 19 can then be produced at the same time in this m×n holder matrix. This advantageously reduces the production costs for the package component 19.

The invention is particularly advantageous for use in a so-called chip scaled package. In this case, the semiconductor body 2 may be, for example, a semiconductor body produced using so-called flip chip technology. The invention is particularly advantageous if the connecting elements 5 are configured with a spherical shape and are bonded to the semiconductor body 2 in the form of a matrix. Such a component is generally called a ball grid array package (BGA package). It is also particularly advantageous to use the BGA package together with CSP technology. In this case, the package is called a micro-ball grid array package ($\mu$-BGA).

I claim:

1. A package for a semiconductor body, the semiconductor body having a first and a second surface, an edge surface surrounding the semiconductor body, and a plurality of contact points on the first surface, the semiconductor body further having a plurality of connecting elements, at least some of the connecting elements making contact with the contact points and via which the semiconductor body can make electrical contact with a printed circuit board, the package comprising:

a first part formed of a thin supporting frame for completely surrounding the edge surface of the semiconductor body, said thin supporting frame having an upper rim rising above the second surface of the semiconductor body at the edge surface and said thin supporting frame formed of a first compound; and a second part formed of a substantially flat cover for entirely covering the second surface of the semiconductor body and at least partially covering said upper rim of said thin supporting frame, said flat cover formed of a second compound and said first compound forming said supporting frame having a substantially greater viscosity than said second compound.

2. The package according to claim 1, wherein said first compound is at least partially composed of a polymer.

3. The package according to claim 1, wherein said second compound is at least partially composed of epoxy resin.

4. The package according to claim 1, including a passivation layer covering regions on the first surface of the semiconductor body which are not provided with the contact points.

5. The package according to claim 1, including a filler at least partially filling regions formed between the connecting elements and the printed circuit board.

* * * * *